United States Patent [19]

Crayford

[11] Patent Number: 5,890,100
[45] Date of Patent: Mar. 30, 1999

[54] CHIP TEMPERATURE MONITOR USING DELAY LINES

[75] Inventor: Ian Crayford, San Jose, Calif.

[73] Assignee: Advanced Micro Devices, Inc., Sunnyvale, Calif.

[21] Appl. No.: 914,262

[22] Filed: Aug. 19, 1997

[51] Int. Cl.⁶ .................................................. G06F 17/40
[52] U.S. Cl. .......................... 702/130; 702/132; 326/50; 326/121; 324/760; 324/765; 364/528.34
[58] Field of Search ................................ 364/557, 528.34; 327/512, 262, 276, 261, 284, 269; 324/763, 760, 765; 702/130, 132; 326/50, 121

[56] References Cited

U.S. PATENT DOCUMENTS

| | | |
|---|---|---|
| 4,970,497 | 11/1990 | Broadwater et al. ................... 340/598 |
| 4,980,586 | 12/1990 | Sullivan et al. ........................ 327/262 |
| 5,132,572 | 7/1992 | Woo . |
| 5,173,864 | 12/1992 | Watanabe et al. ...................... 364/491 |
| 5,220,216 | 6/1993 | Woo . |
| 5,227,679 | 7/1993 | Woo . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,451,894 | 9/1995 | Guo . |
| 5,452,333 | 9/1995 | Guo et al. . |
| 5,457,336 | 10/1995 | Fang et al. . |
| 5,457,719 | 10/1995 | Guo et al. . |
| 5,485,127 | 1/1996 | Bertoluzzi et al. ........................ 331/69 |
| 5,710,515 | 1/1998 | Teggatz et al. .......................... 324/763 |

*Primary Examiner*—Louis Arana
*Assistant Examiner*—Hien Vo

[57] ABSTRACT

A temperature monitor which determines the operating temperature of an integrated circuit chip. The temperature monitor includes a delay line made up of serially connected delay cells. The propagation time of a signal through the delay cells is determined and this value is correlated to a signal representative of chip temperature. Chip temperature values are stored in a memory to produce an operating history of chip temperatures.

15 Claims, 4 Drawing Sheets

CHIP TEMPERATURE MONITOR USING DELAY LINES

FIELD OF THE INVENTION

This invention relates to semiconductor devices and more particularly to monitoring the operating temperature of an integrated circuit chip.

RELATED APPLICATIONS

This application is related to co-pending application to Ian Crayford entitled CHIP TEMPERATURE PROTECTION USING DELAY LINES, Ser. No. 08/914,263 commonly assigned with the present invention.

BACKGROUND OF THE INVENTION

In an integrated circuit chip, the various functions performed by the logic elements on the chip are dependent on variations in chip operating conditions. These chip operating conditions include the chip operating temperature. Chips are often contained in enclosures which experience extreme variations in temperature that can lead to poor chip performance or even chip failure.

When a chip fails to perform properly or crashes, any one of a variety of factors could be the cause. In order to determine the exact cause of a chip failure, complex recorders may be used to store information on the operating state of the chip before the failure. These recorders can store specific information on the chip temperature, chip operating voltages and other process variables. However, this may require the use of complex analog sensors or fast analog-to digital (A/D) converters which can detect and report the status of these variables on a real time basis. These recorders may also store the states in various registers located on the chip at predetermined intervals.

A drawback with such recorders is the large amount of space that they consume on the chip and the increased amount of processing necessary to continually update the status of all the variables. Another drawback is that analog sensors are often sensitive to noise caused by digital switching operations and other factors. Additionally, the cost of such recorders with a number of analog sensors increases with the complexity of the particular device.

Hence, a need exists for providing a temperature monitor that can monitor the temperature conditions of the chip itself without requiring extensive processing or memory space. It additionally is desirable to provide a temperature monitor using digital logic elements that can be updated based on current chip conditions and can be integrated into a digital design.

SUMMARY OF THE INVENTION

A primary object of the invention is to detect variations in the operating temperature of an integrated circuit chip, to be used for diagnostic purposes.

Another object of the invention is to detect variations in chip temperature using digital logic elements that can be integrated into a digital design.

To achieve the foregoing and other objectives and advantages, the present invention utilizes a delay line comprising a plurality of serially connected delay cells. The delay cells have a characteristic propagation delay time that varies with the device's operating temperature. A counter is coupled to the delay line for measuring the propagation time of a signal through the delay line. A temperature detector converts this delay time into a signal representative of chip operating temperature.

In accordance with one aspect of the invention, each delay cell comprises a pair of serially connected inverters.

In a further aspect of the invention, a storage device is used to store a table of chip temperature values for various propagation times.

In another aspect, a memory device is used to store a plurality of values of chip operating temperature establishing an operating history of the chip.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

DETAILED DESCRIPTION OF THE INVENTION

Figure 1:
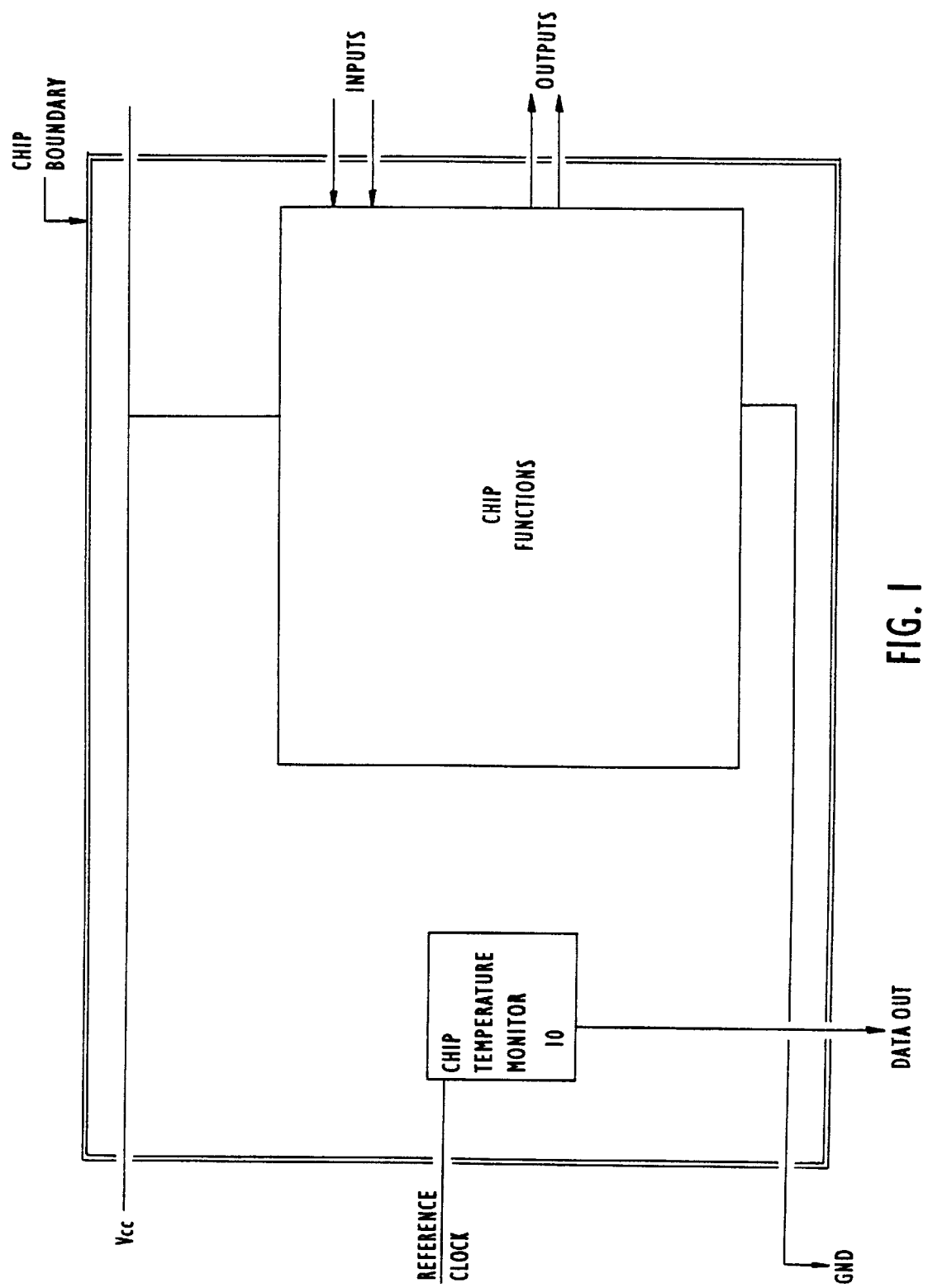
FIG. 1 is a block diagram of a chip temperature monitoring system.

FIG. 1 shows a functional block diagram of a chip temperature monitoring system. In the exemplary embodiment, the chip temperature monitoring system comprises a chip temperature monitor 10 located on the same silicon substrate and having close physical proximity to the chip logic functions. Therefore, the logic elements within the chip temperature monitor 10 are subjected to the same temperature conditions as the chip logic functions. Alternatively, the chip temperature monitor 10 may be a separate entity located in close physical proximity to a chip's logic functions.

The chip temperature monitor 10 is supplied with a clock input signal. This clock input signal is shown supplied from an off-chip source, but may be supplied from an on-chip source which can provide a logic "high" input to the chip temperature monitor 10. The voltage of the input signal should be kept constant. Chip temperature monitor 10 determines the chip operating temperature and stores the value. As temperature conditions on the chip change, the monitor records the current temperature. The contents of the chip temperature monitor 10 contain a history of temperature values and can be transmitted to devices outside the chip. Details of the chip temperature monitor are shown in FIG. 2.

Figure 2:
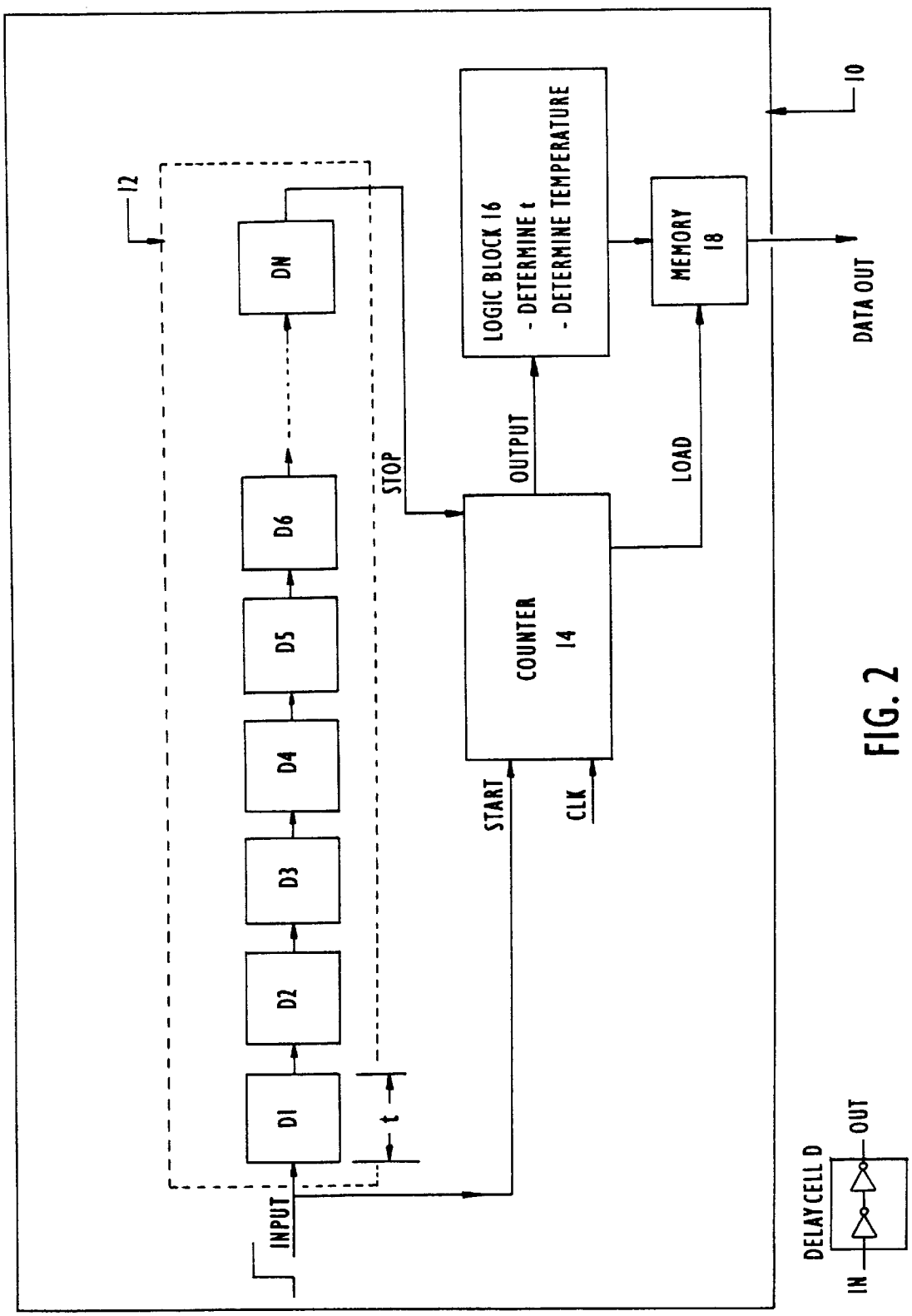
FIG. 2 is a detailed block diagram of the temperature monitoring system of FIG. 1.

With reference to FIG. 2, the chip temperature monitor 10 is made up of a delay line 12, shown outlined by dashed lines. Each of the individual delay cells D comprises a pair of serially connected inverters. The propagation delay time of the delay cells varies with temperature.

As CMOS and other processing technologies provide greater density of devices on chips, long strings of cascaded inverters can be obtained at low cost and the inverters can be used as the basic high resolution unit delay element.

However, other logic elements may also be used as the basic delay element without departing from the spirit of this invention. Examples of cascaded inverters used as high resolution delay elements are in U.S. Pat. Nos. 5,451,894 and 5,457,719, both assigned to the assignee of the present invention.

The number of delay cells N in delay line 12 is chosen by the system designer and is dependent on the desired accuracy of the chip temperature monitor 10. For example, the greater the number N, the less the error will be in determining the delay time of each delay cell.

The counter 14 receives a start input from the input tap of the delay line at the input to D1 and begins counting. The counter 14 continues counting until the output stop signal from the output tap of the delay line at DN stops the counter 14. The counter 14 contains a value which is equal to the propagation time of a signal through N delay cells. The counter 14 outputs this value to logic block 16. Logic block 16 divides the total propagation time t, received from the counter, by N, where N is the number of serially connected delay cells in the delay line 12. The result of this calculation is the actual propagation delay time of a single delay cell at the current temperature. Alternatively, the counter 14 may include logic to perform the calculations performed by logic block 16.

The counter 14 can be any one of many conventional counter devices which are known in the art. The counter is shown on-chip, but alternatively could be located off-chip. In addition, there are many alternative ways to determine the propagation delay time t of the delay cells.

One alternative delay cell timing mechanism includes a delay line oscillator. Using the known propagation delay time t for standard operating conditions, a system designer builds an oscillator by cascading N delay cells together to generate a clock signal with a known period. In order to determine the actual propagation delay of the delay cells based on the particular temperature conditions on the chip, a frequency comparator compares the output of the delay line oscillator to an external reference clock with a known frequency. By comparing the clock signals, the actual propagation time t can be easily calculated.

The delay cells in the delay line 12 may be assigned addresses, as described in U.S. Pat. No. 5,457,719, assigned to the assignee of the present invention. This use of addressing enables logic block 16 and counter 14 to quickly know the length of the delay line and facilitates calculations made by logic block 16 or counter 14.

As discussed earlier, as the temperature of the chip changes, the propagation delay time of the delay cells changes. Logic block 16 determines the chip operating temperature from the actual propagation time t. Logic block 16 contains a table of stored temperatures which correlate to various propagation times. For example, it may be known that a propagation time of 140 picoseconds for a single delay cell corresponds to a temperature of X° Celsius (C) at a constant voltage. Logic block 16 stores the information that a delay time of 140 picoseconds corresponds to a chip temperature of X° C. Therefore, whenever the propagation time of a signal through a single delay cell is found to be 140 picoseconds, logic block 16 outputs a temperature value of X° C. to memory 18. Additionally, the table of stored temperature values correlated to various propagation times may be programmable, to correlate any delay to temperature.

The propagation times for the various temperatures stored in logic block 16 are generated under controlled conditions. These propagation times are generated experimentally by subjecting the chip through a range of temperature values and determining the corresponding propagation delay times. Other variables, such as voltage are kept constant throughout this process. The experimental range includes temperature values above which and below which the chip will fail to perform properly or crash.

For a given process, die-to-die and wafer-to-wafer variations can be determined by evaluation. Therefore, temperature profiles for a given process can be easily correlated for all devices constructed on this same process. Hence, it is unnecessary to evaluate each device or wafer lot individually.

Further, if process lot variation is of concern, a self-compensating circuit can be constructed using the same native structures, which effectively cancels out any process variation. In this case, a similar inverter chain is constructed. When fed with a known input, the chain length is varied by adding or removing individual inverter stages, until a fixed and desired delay is achieved. This number of inverters acts as a reference for the actual measurement delay chain, which may be statically or dynamically programmed to use an appropriate number of delay elements based on the reference delay chain.

Logic block 16 outputs its information and memory 18 writes the information when a load pulse from counter 14 is received by memory 18. Alternatively, the results of the determination made by logic block 16 may be held until a load pulse is received at the logic block 16. This pulse signals logic block 16 to write its contents to memory 18. Alternatively, if a predetermined over/under temperature value is determined, the temperature may be prevented from being written to memory so that a second determination can be made to ensure that the temperature determination is not erroneous.

The counter 14 is coupled to a reference clock and generates the load pulse every predetermined period of time. This reference clock may be the same clock signal which supplies the input signal to the delay line. The counter 14 generates the load pulse every T seconds. The value of T is dependent upon the particular application needs and is programmable. The counter may also be used to control how often the temperature is monitored. The counter 16 transmits a load pulse to memory 18 every T seconds which stores a value indicating the chip temperature at the current time.

Figure 3:
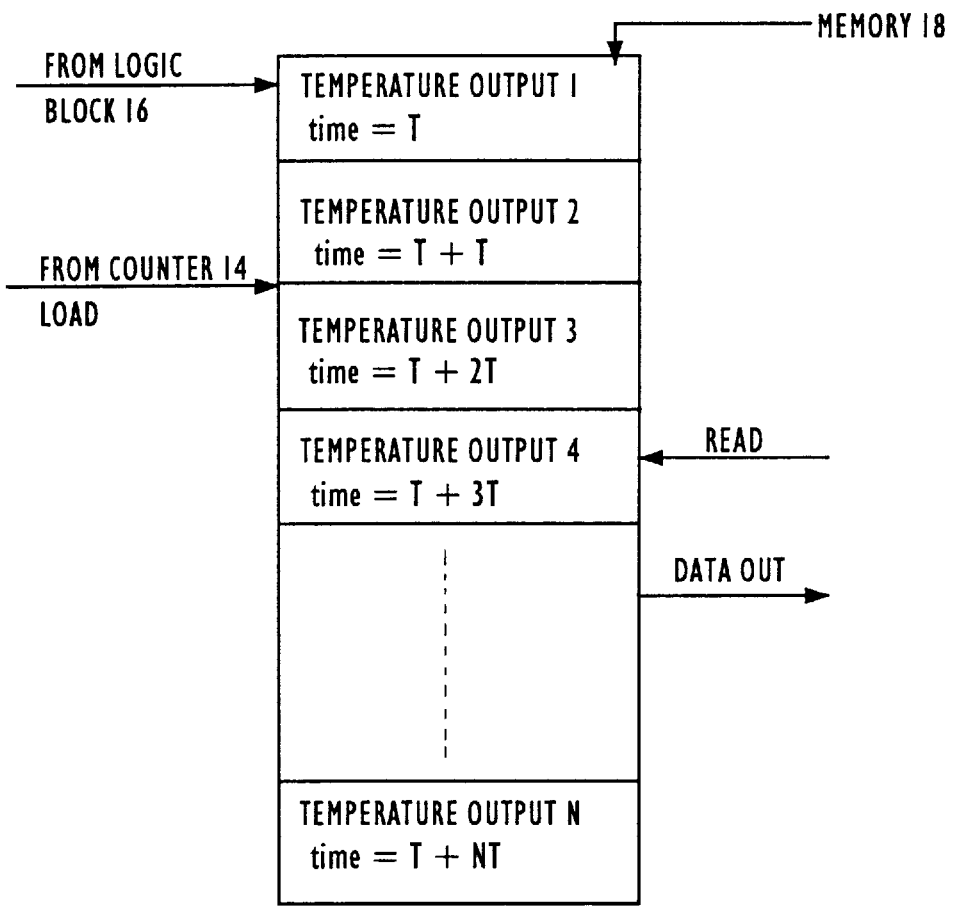
FIG. 3 is a block diagram of the memory of FIG. 2.

With reference to FIG. 3, the memory contains a history of values indicating the operating temperature of the chip. The contents of memory 18 may also contain a time stamp which indicates the time that the temperature reading was made. The memory 18 is read out by applying a read signal to the memory 18. In addition, the memory 18 is shown on-chip, but could also be located off-chip. The memory 18 could even be located at a central diagnostic facility where the operating conditions of various chips are monitored.

The memory 18 functions as a diagnostic tool which may indicate why the chip failed to perform properly. In the event that a chip failure occurs, a diagnosis of the problem may begin with reading out the contents of the memory 18.

For example, assume that the chip stopped performing its logic functions at a time A without any outward indication of the problem. An initial diagnosis is performed on memory 18. A read signal is applied to the memory 18 and the contents of the memory 18 are read out. The read path of memory 18 may be separated from the normal data path to/from other chip functions, such that in the event of a failure, the memory 18 can still be read.

The values in memory 18 contain a time stamp which assists in the diagnosis. In this example, assume that the counter 14 and logic block 16 determine that the propagation delay through the pair of inverters at time A is 150 picoseconds, and this correlates to a temperature of Y° C. Correspondingly, the other logic elements on the same silicon substrate are subjected to the same temperature conditions. Therefore, memory 18 stores a value indicating that the chip is running at a temperature of Y° C. at time A.

A system troubleshooter looks at this temperature value and determines whether the chip operating temperature threshold has been exceeded. If the temperature is within the operating range of the chip, the troubleshooter knows that another problem caused the chip failure. The contents of memory 18 may not be able to always pinpoint the problem to the exact variable, but can eliminate temperature as the problem.

Figure 4:
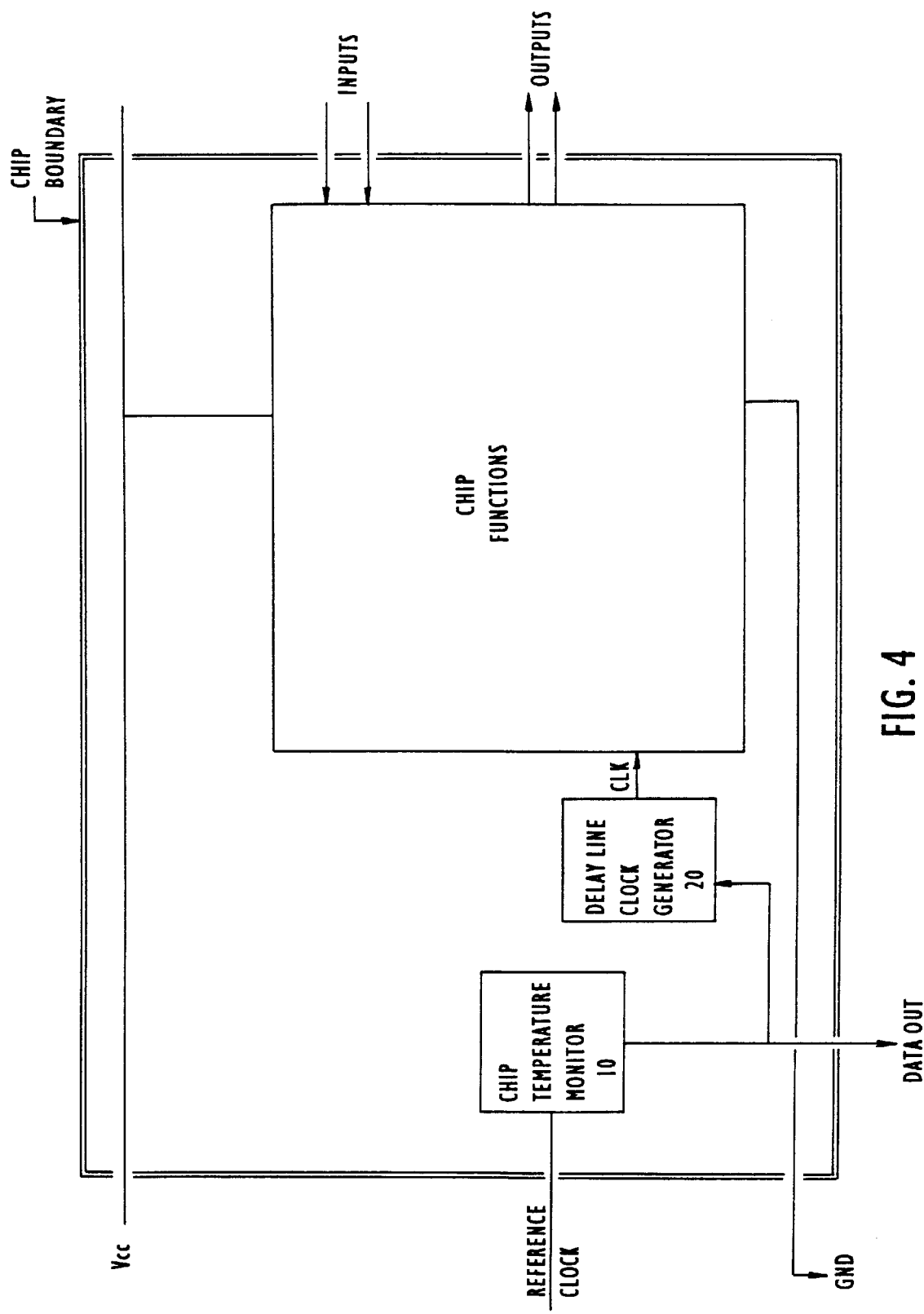
FIG. 4 is a block diagram of the chip temperature monitoring system within a design including a clock generator.

With reference to FIG. 4, the chip operating temperature monitor 10 is shown integrated into a design which includes a delay line clock generator 20. The output of logic block 16 is used to determine the optimum clock frequency for the chip logic functions. The delay line clock generator 20 knows how much the delay cells have either slowed down or sped up in operation, in percentage from the standard value. The delay line clock generator 20 adjusts the optimum operating frequency of the chip logic functions by this same percentage and generates a clock signal of this frequency. From FIG. 4, it is seen that the chip temperature monitor can be readily integrated into a digital design and does not require much increased processing or chip space.

Described has been a system and method for recording the operating temperature of an integrated circuit chip. An advantage of the invention is that the monitor requires no additional semiconductor processing steps, minimal additional processing overhead and consumes little space on the chip. Another advantage of the invention is that the recorder uses only standard logic cells that can be readily integrated with the digital functions on the chips In this disclosure, there is shown and described only the preferred embodiments of the invention, but, as aforementioned, it to be understood that the invention is capable of use in various other combinations and environments and is capable of changes or modifications within the scope of the inventive concept as expressed herein.

What is claimed is:

1. An integrated circuit temperature monitoring system comprising:
    a delay line comprising a plurality of serially connected delay cells;
    a counter coupled to the delay line for measuring the propagation time of a signal through the delay line; and
    a temperature detector coupled to the counter for generating, based on the signal propagation time, a signal representative of chip temperature, wherein the temperature detector includes a programmable memory for correlating the signal propagation time to a temperature value.

2. The integrated circuit temperature monitoring system of claim 1, wherein each delay cell comprises a pair of serially connected inverters.

3. The integrated circuit temperature monitoring system of claim 1, wherein each delay cell comprises a repeating pattern of logic gates.

4. The integrated circuit temperature monitoring system of claim 1, wherein the temperature detector includes a stored table of chip temperature values for various propagation times.

5. The integrated circuit temperature monitoring system of claim 1, wherein the counter is located on the chip.

6. The integrated circuit temperature monitoring system of claim 1, wherein the counter is located off the chip.

7. An integrated circuit temperature monitoring system comprising:
    a delay line comprising a plurality of serially connected delay cells;
    a counter coupled to the delay line for measuring the propagation time of a signal through the delay line; and
    a temperature detector coupled to the counter for generating, based on the signal propagation time, a signal representative of chip temperature, wherein the counter is operative for determining the propagation time of a delay cell by dividing the propagation time of the signal by the number of delay cells.

8. A method of detecting the temperature of an integrated circuit, comprising the steps of:
    a) passing a signal through N serially connected delay cells;
    b) measuring propagation time of the signal through the N cells by dividing the propagation time of the signal by N; and
    c) outputting a signal representative of chip temperature based on the result of step b.

9. The method of claim 8, further comprising the step of:
    d) storing the result of step c).

10. An integrated circuit temperature monitoring system comprising:
    a delay line coupled to a reference clock comprising a plurality of serially connected delay cells;
    a reference clock coupled to the delay line and the counter for supplying an input signal to the delay line;
    a counter coupled to the delay line for measuring propagation time of a signal through the delay line and for generating a pulse each predetermined period of time;
    a temperature detector coupled to the counter for generating, based on the signal propagation time, a signal representative of chip temperature; and
    a memory coupled to the temperature detector, wherein the counter is configured to provide the pulse to the memory for loading the signal representative of chip temperature to the memory and the memory is configured to store information indicating the time the chip temperature was generated.

11. The integrated circuit temperature monitoring system of claim 10, wherein the temperature detector further comprises:
    a logic circuit configured to prevent a signal representing a predetermined temperature from being written to memory.

12. The integrated circuit temperature monitoring system of claim 10, wherein the memory is located on the chip.

13. The integrated circuit temperature monitoring system of claim 10, wherein the memory is located off-chip.

14. The integrated circuit temperature monitoring system of claim 10, including an output at which the contents of the memory are produced for read out.

15. The integrated circuit temperature monitoring system of claim 1, comprising:
    a clock generator coupled to the temperature detector for generating a system clock, based on the output of the temperature detector.

* * * * *